(12) United States Patent
Komori

(10) Patent No.: US 9,558,940 B2
(45) Date of Patent: Jan. 31, 2017

(54) METHOD AND APPARATUS FOR FORMING SILICON FILM

(71) Applicant: TOKYO ELECTRON LIMITED, Tokyo (JP)

(72) Inventor: Katsuhiko Komori, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 20 days.

(21) Appl. No.: 14/156,097

(22) Filed: Jan. 15, 2014

(65) Prior Publication Data

US 2014/0199824 A1 Jul. 17, 2014

(30) Foreign Application Priority Data

Jan. 17, 2013 (JP) .................. 2013-006042

(51) Int. Cl.
*H01L 21/02* (2006.01)
*H01L 21/3205* (2006.01)
*H01L 21/3213* (2006.01)
*H01L 21/3215* (2006.01)
(Continued)

(52) U.S. Cl.
CPC ..... *H01L 21/02532* (2013.01); *H01L 21/0243* (2013.01); *H01L 21/0245* (2013.01); *H01L 21/02494* (2013.01); *H01L 21/02658* (2013.01); *H01L 21/28525* (2013.01);
(Continued)

(58) Field of Classification Search
CPC ............. H01L 21/02532; H01L 21/28525; H01L 21/76877; H01L 21/32055; H01L 21/32155; H01L 21/32135; H01L 21/02494; H01L 21/0245; H01L 21/02658; H01L 21/0243; H01L 21/02365; H01L 21/20; H01L 29/7813; H01L 27/10832; H01L 28/75; H01L 28/87; H01L 28/91; H01L 27/10835; H01L 27/1087; H01L 27/10829; H01L 27/10838; H01L 29/66181; H01L 29/945
See application file for complete search history.

(56) References Cited

U.S. PATENT DOCUMENTS 5,527,720 A * 6/1996 Goodyear ........... H01L 27/0255
                                                      257/E29.014
5,943,581 A * 8/1999 Lu .................... H01L 27/10832
                                                         257/E21.65
6,495,294 B1 * 12/2002 Yamauchi et al. ............ 438/597
(Continued)

FOREIGN PATENT DOCUMENTS

JP          04-119631 A       4/1992
JP          10-321556 A      12/1998
(Continued)

*Primary Examiner* — Julio J Maldonado
*Assistant Examiner* — Stanetta Isaac
(74) *Attorney, Agent, or Firm* — Nath, Goldberg & Meyer; Jerald L. Meyer

(57) ABSTRACT

A method of forming a silicon film in grooves formed on a surface of an object to be processed, the method including forming a first silicon film containing impurities so as to embed the first silicon film in the grooves of the object to be processed; doping the impurities in the vicinity of the surface of the first silicon film; expanding opening portions of the grooves by etching the first silicon film thereby forming expanded openings having grooves; and forming a second silicon film so as to embed the second silicon film in the grooves of the expanded openings is provided.

3 Claims, 6 Drawing Sheets

(51) Int. Cl.
*H01L 21/285* (2006.01)
*H01L 21/768* (2006.01)

(52) U.S. Cl.
CPC .. *H01L 21/32055* (2013.01); *H01L 21/32135* (2013.01); *H01L 21/32155* (2013.01); *H01L 21/76877* (2013.01)

(56) References Cited

U.S. PATENT DOCUMENTS

2003/0139012 A1* 7/2003 Yamauchi et al. ............ 438/269
2004/0005745 A1* 1/2004 Nakamura ........ H01L 21/67253
438/174
2005/0221547 A1* 10/2005 Yamauchi et al. ............ 438/172

FOREIGN PATENT DOCUMENTS

| JP | 2012-004542 A | 1/2012 |
| JP | 2013-026513 A | 2/2013 |
| JP | 2013-033933 A | 2/2013 |

* cited by examiner

# METHOD AND APPARATUS FOR FORMING SILICON FILM

CROSS-REFERENCE TO RELATED APPLICATION

This application claims the benefit of Japanese Patent Application No. 2013-006042, filed on Jan. 17, 2013, in the Japan Patent Office, the disclosure of which is incorporated herein in its entirety by reference.

TECHNICAL FIELD

The present disclosure relates to a method and an apparatus of forming a silicon film.

BACKGROUND

In the manufacturing process of a semiconductor device or the like, there has been a process of forming an electrode by forming a trench and hole-shaped groove (for example, a contact hole or a line-and-space) in an interlayer insulating film on a silicon substrate, and by embedding a silicon film (Si film) such as a polysilicon film, an amorphous silicon film, and a polysilicon film and an amorphous silicon film doped with impurities.

In such a process, for example, there has been a method of forming a contact hole in the interlayer insulating film on the silicon substrate, forming the polysilicon layer using a CVD (Chemical Vapor Deposition) method, and forming the polysilicon film again after slight etching of the polysilicon film.

However, when a surface roughness of the silicon film is degraded in the etching process after forming the silicon film, the silicon film cannot be properly embedded, which may result in a degradation of characteristics as an electrode of the Si film. Furthermore, this problem remarkably arises particularly in the case of using a silicon film doped with phosphorus (P).

SUMMARY

Some embodiments of the present disclosure provide a method of forming a silicon film and a forming apparatus thereof capable of embedding the silicon film to prevent degradation of characteristics. Furthermore, in some embodiments, a method of forming a silicon film and a forming apparatus thereof capable of suppressing the degradation of the surface roughness after etching is provided.

According to one embodiment of the present disclosure, a method of forming a silicon film in grooves formed on a surface of an object to be processed, the method including forming a first silicon film containing impurities so as to embed the first silicon film in the grooves of the object to be processed; doping the impurities in the vicinity of the surface of the first silicon film; expanding opening portions of the grooves by etching the first silicon film thereby forming expanded openings having grooves; and forming a second silicon film so as to embed the second silicon film in the grooves of the expanded openings.

According to another embodiment of the present disclosure, an apparatus of forming a silicon film in grooves formed on a surface of an object to be processed, the apparatus includes a first film forming unit configured to form a first silicon film containing impurities so as to embed the first silicon film in the grooves of the object to be processed; a doping unit configured to dope the impurities in the vicinity of the surface of the first silicon film formed by the first film forming unit; an etching unit configured to expand the opening portions of the grooves by etching the first silicon film formed by the first film forming unit; and a second film forming unit configured to form a second silicon film so as to embed the second silicon film in the grooves in which the openings are expanded by the etching unit.

BRIEF DESCRIPTION OF THE DRAWINGS

The accompanying drawings, which are incorporated in and constitute a unit of the specification, illustrate embodiments of the present disclosure, and together with the general description given above and the detailed description of the embodiments given below, serve to explain the principles of the present disclosure.

DETAILED DESCRIPTION

A first embodiment of the present disclosure will now be described in detail with reference to the drawings.

Hereafter, the method and apparatus of forming the silicon film of the present disclosure will be described. In this embodiment, the description will be given of an example where a batch type vertical heat treatment device illustrated in FIG. 1 is used as the apparatus of forming the silicon film.

Figure 1:
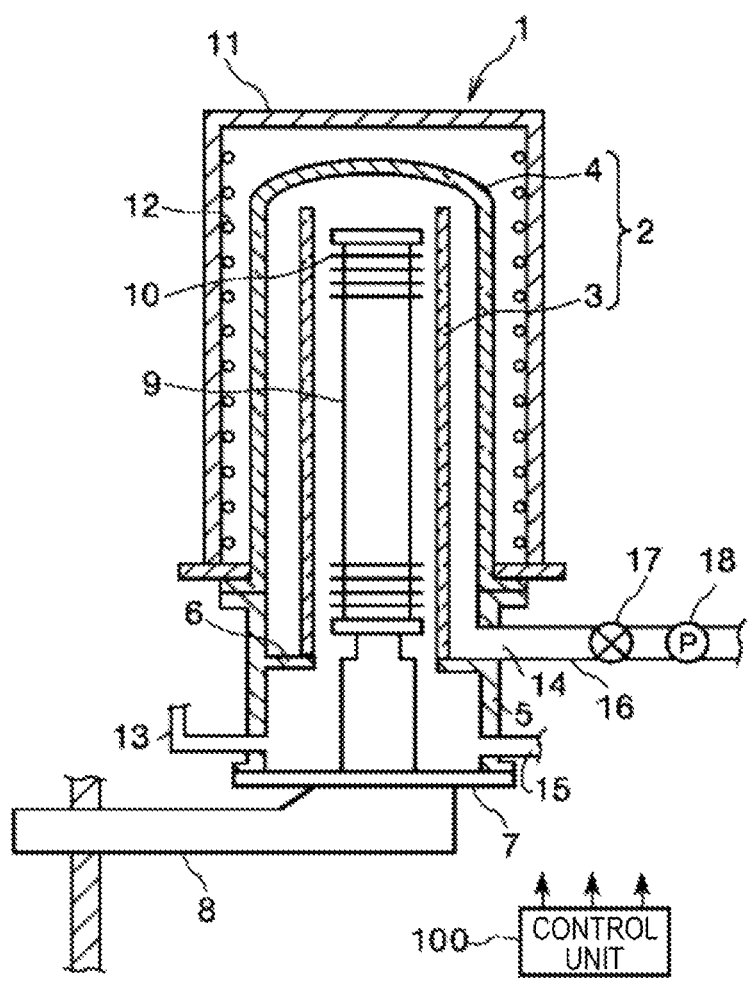
FIG. 1 is a diagram illustrating a heat treatment device according to an embodiment of the present disclosure.

As illustrated in FIG. 1, the heat treatment device 1 includes a reaction tube 2 having a substantially cylindrical shape in which a longitudinal direction is oriented in a vertical direction. The reaction tube 2 has a double tube structure that includes an inner tube 3, and an outer tube 4 having a ceiling formed to cover the inner tube 3 and to have a regular interval between the inner tube 3 and the outer tube 4. The inner tube 3 and the outer tube 4 are formed by materials having excellent heat resistance and corrosion resistance, for example, quartz.

A manifold 5 made of stainless steel (SUS) formed in a cylindrical shape is disposed below the outer tube 4. The manifold 5 is hermetically coupled to the lower end portion of the outer tube 4. Moreover, the inner tube 3 protrudes from an inner wall of the manifold 5, and is supported by a support ring 6 formed integrally with the manifold 5.

A lid 7 is disposed below the manifold 5, and the lid 7 is vertically movable by a boat elevator 8. Furthermore, when the lid 7 is raised by the boat elevator 8, a lower side of the manifold 5 (a furnace port portion) is closed, and when the lid 7 is lowered by the boat elevator 8, the lower side of the manifold 5 (the furnace port portion) is opened.

A wafer boat 9 made of, for example, quartz is mounted on the cover 7. The wafer boat 9 is configured to be able to accommodate a plurality of objects to be processed, for example, semiconductor wafers 10 at predetermined intervals in the vertical direction.

A heat insulating member 11 is provided around the reaction tube 2 so as to surround the reaction tube 2. In this embodiment, a heating-up heater 12 including a resistive heating element is provided on the inner wall surface of the heat insulating member 11. The interior of the reaction tube 2 is heated to a predetermined temperature by the heating-up heater 12, and as a result, the semiconductor wafer 10 is heated to a predetermined temperature.

A plurality of process gas introduction pipes 13 is inserted (coupled) through the side surface of the manifold 5. In addition, only one process gas introduction pipe 13 is illustrated in FIG. 1. The process gas introduction pipe 13 is disposed so as to face the inner tube 3. In this embodiment, as illustrated in FIG. 1, the process gas introduction pipe 13 is inserted through the side surface of the manifold 5 lower than the support ring 6 (the lower side of the inner tube 3).

The process gas introduction pipe 13 is coupled to a process gas supply source (not illustrated) through a mass flow controller (not illustrated) or the like. Therefore, a desired amount of process gas is supplied into the reaction tube 2 from the process gas supply source through the process gas introduction pipe 13. The process gas supplied from the process gas introduction pipe 13 includes a film forming gas that forms a silicon film (a Si film) such as a polysilicon film and an amorphous silicon film doped with impurities. As the film forming gas, for example, monosilane ($SiH_4$) or the like is used as a silicon source, and for example, phosphine ($PH_3$) is used to dope the impurities.

Moreover, in the method of forming the silicon film according to an embodiment, as described below, after the Si film is embedded in the groove formed on the surface of the semiconductor wafer 10 in a first film forming step, the opening portion of the groove embedded in the etching step is expanded, and the Si film is embedded in the groove in which the opening portion is expanded in a second film forming step. In these steps, an etching gas is adopted as a process gas supplied from the process gas introduction pipe 13. For example, chlorine ($Cl_2$) is used as the etching gas.

An exhaust port 14 configured to exhaust the gas in the reaction tube 2 is provided on the side surface of the manifold 5. The exhaust port 14 is provided above the support ring 6, and communicates with a space formed between the inner tube 3 and the outer tube 4 of the reaction tube 2. Moreover, gas or the like generated in the inner tube 3 is exhausted to the exhaust port 14 through the space between the inner tube 3 and the outer tube 4.

A purge gas supply pipe 15 is inserted below the exhaust port 14 on the side surface of the manifold 5. A purge gas supply source (not illustrated) is coupled to the purge gas supply pipe 15, and a desired amount of purge gas, for example, nitrogen gas is supplied into the reaction tube 2 from the purge gas source through the purge gas supply pipe 15.

An exhaust pipe 16 is hermetically coupled to the exhaust port 14. A valve 17 and a vacuum pump 18 are interposed in the exhaust pipe 16 from the upstream side thereof. The valve 17 controls the pressure in the reaction tube 2 to a predetermined pressure by adjusting a degree of opening of the exhaust pipe 16. The vacuum pump 18 exhausts the gas in the reaction tube 2 through the exhaust pipe 16, and adjusts the pressure in the reaction tube 2.

Furthermore, a trap, a scrubber and the like (not illustrated) are interposed in the exhaust pipe 16, and are configured to exhaust gas exhausted from the reaction tube 2 to the outside of the heat treatment device 1 after detoxification.

Figure 2:
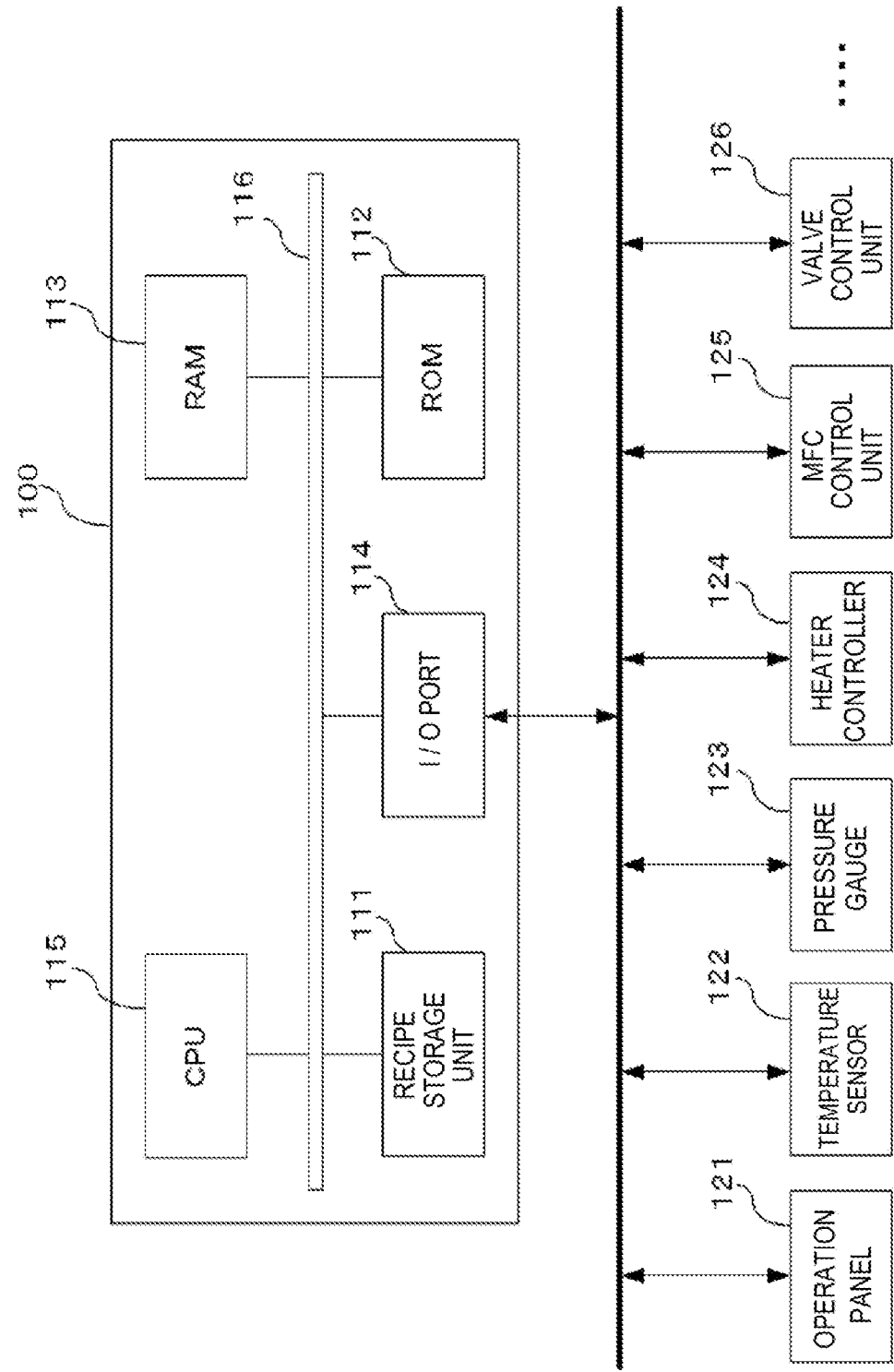
FIG. 2 is a diagram illustrating a configuration of a controller of FIG. 1.

Furthermore, the heat treatment device 1 includes a controller 100 that controls the respective units. FIG. 2 illustrates the configuration of the controller 100. As illustrated in FIG. 2, a manipulation panel 121, a temperature sensor (group) 122, pressure gauges (group) 123, a heater controller 124, a MFC (Mass Flow Controller) controller 125, a valve controller 126 and the like are coupled to the controller 100.

The manipulation panel 121 includes a display screen and an operation button, transmits operation instructions of an operator to the controller 100, and displays various types of information from the manipulation panel 121 on the display screen.

The temperature sensor (group) 122 measures the temperature of each unit such as in the reaction tube 2, in the process gas introduction pipe 13, and in exhaust pipe 16, and notifies the measurements to the controller 100.

The pressure gauge (group) 123 measures the pressure of each unit such as in the reaction tube 2, in the process gas introduction pipe 13, and in exhaust pipe 16, and notifies the measurements to the controller 100.

The heater controller 124 is intended to individually control the heating-up heaters 12, and control the heaters to generate heat by supplying the electric current to the heaters in response to the instructions from the controller 100, individually measures the power consumption of the heaters, and notifies the measurements to the controller 100.

The MFC controller 125 controls the mass flow controller (MFC) (not illustrated) provided in the process gas introduction pipe 13 and the purge gas supply pipe 15, sets the flow rate of the gas flowing through these tubes as the amount specified from the controller 100, measures the flow rate of the actually flowed gas, and notifies the measurements to the controller 100.

The valve controller 126 controls the degree of opening of the valves placed in each tube in accordance to the value specified from the controller 100.

The controller 100 includes a recipe storage unit 111, a ROM (Read Only Memory) 112, a RAM (Random Access Memory) 113, an I/O port (Input/Output Port) 114, a CPU (Central Processing Unit) 115, and a bus 116 that connects these components to one another.

A setup recipe and a plurality of process recipes are stored in the recipe storage unit 111. Only the setup recipe is stored at the initial production of the heat treatment device 1. The setup recipe is performed when generating a thermal model or the like according to each heat treatment device. The process recipe is a recipe that is prepared in each heat treatment (process) actually performed by a user, and defines a change in temperature of each unit, a pressure change in the reaction tube 2, the timing of the start and stop of the supply of the process gas, the supply quantity or the like, for example, from the time of loading the semiconductor wafer 10 into the reaction tube 2 to the time of unloading the processed semiconductor wafer 10.

The ROM 112 is a recording medium that includes an EEPROM (Electrically Erasable Programmable Read Only Memory), a flash memory, a hard disk, and the like, and stores an operation program or the like of the CPU 115.

The RAM 113 serves as a work area of the CPU 115.

The I/O port 114 is coupled to the manipulation panel 121, the temperature sensor 122, the pressure gauge 123, the heater controller 124, the MFC controller 125, the valve controller 126 and the like, and controls the input and output of data and signal.

The CPU 115 forms the center of the controller 100, executes a control program stored in the ROM 112, and controls the operation of the heat treatment device 1 depending on the recipe (process recipe) stored in the recipe storage unit 111 in accordance with the instruction from the manipulation panel 121. According to one embodiment, the CPU 115 allows the temperature sensor (group) 122, the pressure gauge (group) 123, the MFC controller 125 or the like to measure the temperature, the pressure, the flow rate or the like of each unit in the reaction tube 2, in the process gas introduction pipe 13, and in the exhaust pipe 16, outputs the control signal or the like to the heater controller 124, the MFC controller 125, and valve controller 126 or the like on the basis of the measurement data, and controls each unit to follow the process recipe.

The bus 116 transmits the information between each unit.

Figure 3:
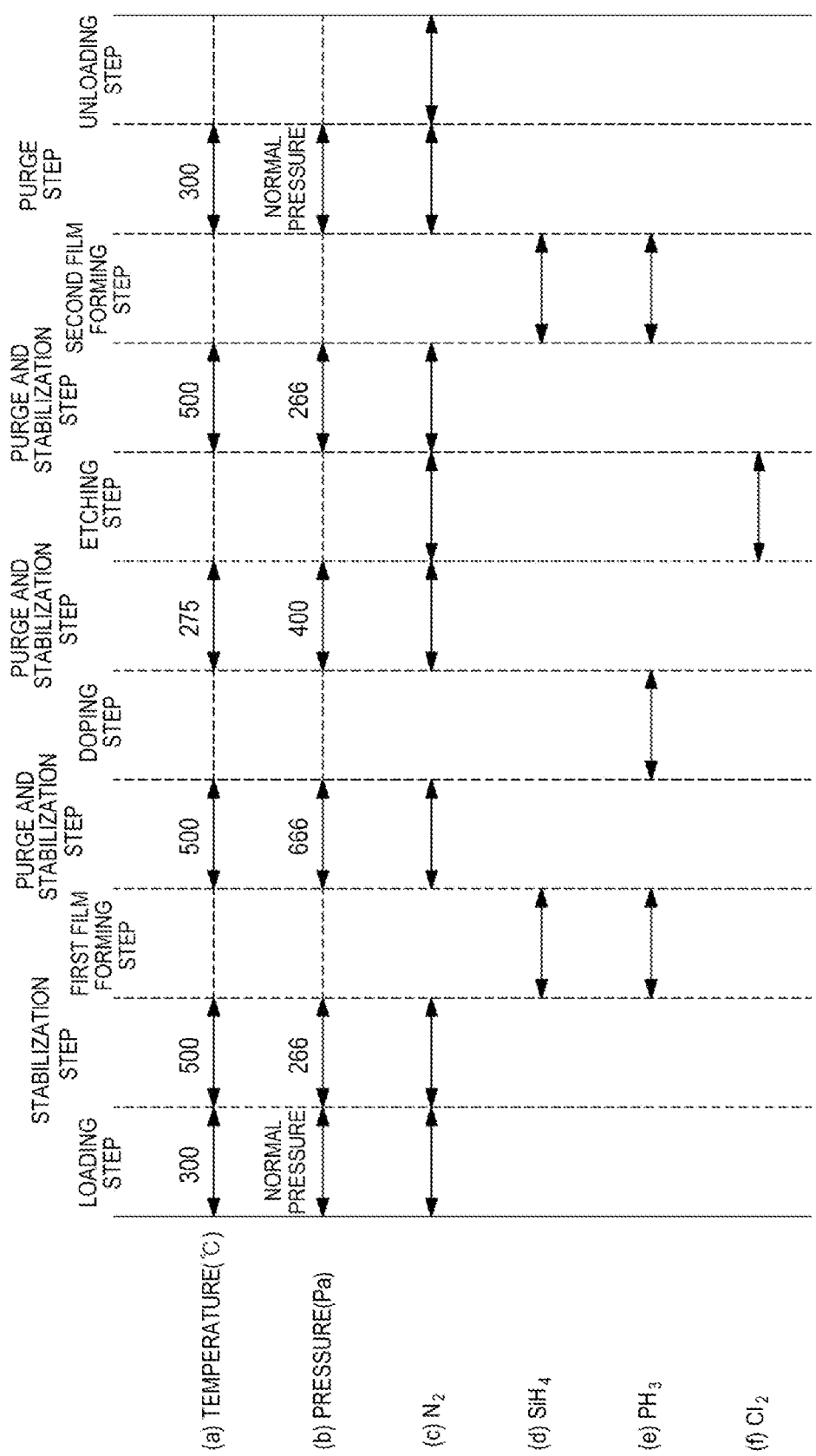
FIG. 3 is a diagram illustrating a recipe that describes a method of forming a silicon film according to an embodiment.

Next, the method of forming the silicon film using the heat treatment device 1 configured as described above will be described. According to one embodiment, the operation of each unit forming the heat treatment device 1 is controlled by the controller 100 (CPU 115) in the following description. According to one embodiment, the temperature, the pressure, the flow rate of the gas or the like of the reaction tube 2 in each treatment are set to the conditions according to the recipe for example, as illustrated in FIG. 3, by controlling the heater controller 124 (the heating-up heater 12), the MFC controller 125, the valve controller 126 or the like by the controller 100 (CPU 115).

Figure 4A:
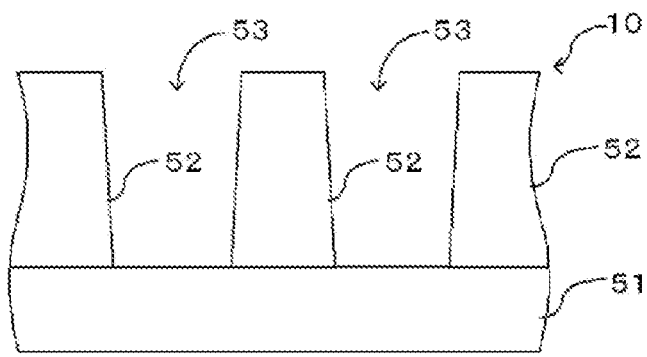
FIGS. 4A to 4D are diagrams illustrating a method of forming the silicon film according to an embodiment.

Furthermore, in this embodiment, as illustrated in FIG. 4A, in the semiconductor wafer 10 as an object to be processed, an insulating film 52 is formed on the substrate 51, and grooves 53 configured to form contact holes are formed on the surface of the semiconductor wafer 10. The method of forming the silicon film according to one embodiment includes a first film forming step of forming a silicon film (a Si film) such as a polysilicon film and an amorphous silicon film doped with impurities so as to embed the grooves 53 formed on the surface of the semiconductor wafer 10, a doping step of doping the impurities using the gas containing the impurities, an etching step of expanding the opening portions of the grooves 53 by etching the formed Si film, and a second film forming step of forming the film so as to embed the Si film in the grooves 53 in which the opening portions are expanded in the etching step. Hereafter, the method of forming the silicon film including these steps will be described.

First, the interior of the reaction tube 2 (the inner tube 3) is set to a predetermined temperature, for example, 300 degrees C. as illustrated in FIG. 3A. Furthermore, as illustrated in FIG. 3C, a predetermined amount of nitrogen ($N_2$) is supplied into the inner tube 3 (the reaction tube 2) from the purge gas supply pipe 15. Next, a wafer boat 9 with the semiconductor wafer 10 illustrated in FIG. 4A accommodated thereon is mounted on the lid 7. Moreover, the lid 7 is raised by the boat elevator 8, and the semiconductor wafer 10 (the wafer boat 9) is loaded into the reaction tube 2 (a loading step).

Subsequently, as illustrated in FIG. 3C, a predetermined amount of nitrogen is supplied into the inner tube 3 from the purge gas supply pipe 15, and the interior of the reaction tube 2 is set to a predetermined temperature, for example, 500 degrees C. as illustrated in FIG. 3A. Furthermore, by discharging the gas in the reaction tube 2, the reaction tube 2a is set to a predetermined pressure, for example, 266 Pa (2 Torr) as illustrated in FIG. 3B. Moreover, the interior of the reaction tube 2 is stabilized at this temperature and pressure (a stabilization step).

According to one embodiment, the temperature in the reaction tube 2 is preferably 450 to 700 degrees C., and more preferably 490 to 650 degrees C. In addition, the pressure in the reaction tube 2 is preferably 13.3 Pa to 666 Pa (0.1 Torr to 5 Torr). This is because the Si film can be more uniformly formed by setting the temperature and the pressure of the reaction tube 2 within these ranges.

Figure 4B:
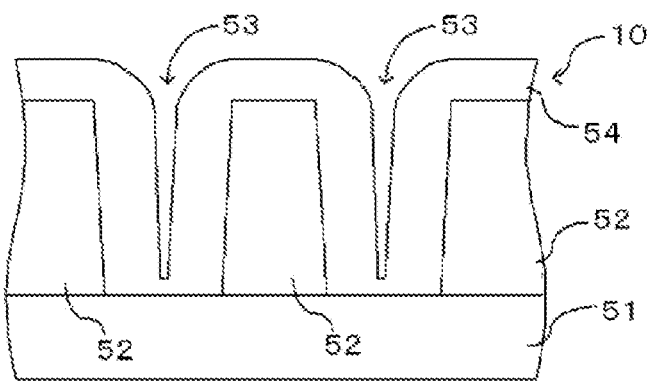

When the interior of the reaction tube 2 is stabilized at the predetermined pressure and temperature, the supply of nitrogen from the purge gas supply pipe 15 is stopped. Moreover, as illustrated in FIGS. 3D and 3E, a predetermined amount of film forming gas, for example, monosilane ($SiH_4$) and phosphine ($PH_3$) are supplied into the reaction tube 2 from the process gas introduction pipe 13 (a first film forming step). With the first film forming step, as illustrated in FIG. 4B, a Si film 54 doped with impurities is formed on the insulating film 52 and in the grooves 53 of the semiconductor wafer 10. Furthermore, the concentration of impurities of the Si film 54 after the first film forming step is, for example, approximately $3 \times 10^{20}$ cm$^{-3}$.

According to one embodiment, it is preferable to form the Si film 54 on the insulating film 52 and in groove 53 of the semiconductor wafer 10 to have the opening portions of grooves 53 in the first film forming step. That is, in the first film forming step, the Si film 54 is not formed to completely embed the grooves 53, but the Si film 54 is preferably formed so that the grooves 53 have the opening portions. As a result, it is possible to prevent an occurrence of a void in the grooves 53 in the first film forming step.

When a predetermined amount of Si film is formed on the semiconductor wafer 10, the supply of the film forming gas from the process gas introduction pipe 13 is stopped. Next, as illustrated in FIG. 3C, a predetermined amount of nitrogen is supplied into the inner tube 3 from the purge gas supply pipe 15, and the interior of the reaction tube 2 is set to a predetermined temperature, for example, 500 degrees C. as illustrated in FIG. 3A. Furthermore, by discharging the gas in the reaction tube 2, the reaction tube 2 is set to a predetermined pressure, for example, 666 Pa (5 Torr) as illustrated in FIG. 3B. Moreover, the interior of the reaction tube 2 is stabilized at this temperature and pressure (a purge and stabilization step).

Next, as illustrated in FIG. 3E, $PH_3$ is supplied into the reaction tube 2, the interior of the reaction tube 2 is stabilized at the predetermined pressure and temperature, and impurities are doped (a doping step). According to one embodiment, is the amorphous silicon film is used as the Si film 54, the temperature of the reaction tube 2 is set, in some embodiments, to a temperature at which the amorphous silicon does not crystallize, for example, to 500 degrees C. Furthermore, the pressure is in some embodiments set to, for example, 13.3 Pa to 53 kPa (0.1 Torr to 400 Torr). By performing a gas phase dope using $PH_3$ as the gas containing the impurities, phosphorus (P) as impurities is additionally doped in a region near the surface of the Si film 54 subjected to the etching removal in the etching step. For example, the concentration of impurities near the surface of the Si film 54 after the doping step is approximately $3 \times 10^{21}$ cm$^{-3}$.

In the present embodiment, by providing the doping step before the etching step in this manner, it is possible to suppress the degradation of the surface roughness of the Si film after the etching step.

Figure 5A:
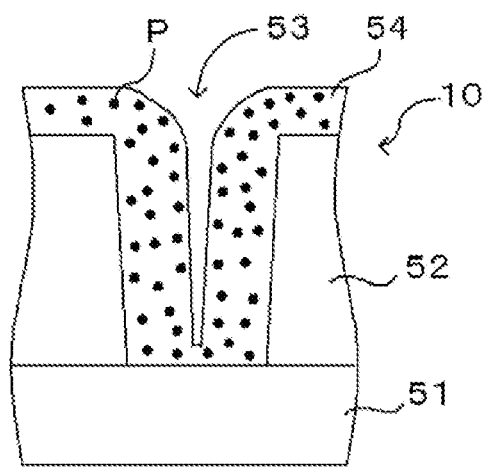
FIGS. 5A and 5B are diagrams illustrating a method of forming the silicon film without performing a doping step.
Figure 5B:
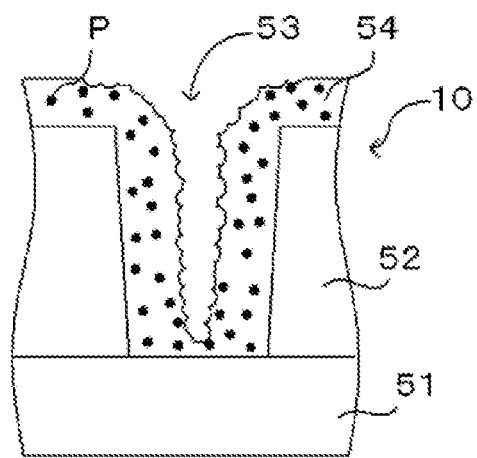

For example, when paying attention only to the vicinity of the surface of the Si film after the first film forming step, as schematically illustrated in FIG. 5A, there is a local variation of the impurity concentrations on the surface of the Si film 54. The etching rate of the Si film doped with impurities is several times higher than the Si film that is not doped with impurities. Accordingly, it is assumed that when performing the etching step in a state where there is a variation in the impurity concentration, as illustrated in FIG. 5B, a portion in which etching proceeds more quickly and a portion in which etching proceeds slowly are generated, irregularities are likely to occur on the surface of the Si film 54, and the surface roughness is degraded.

Figure 6A:
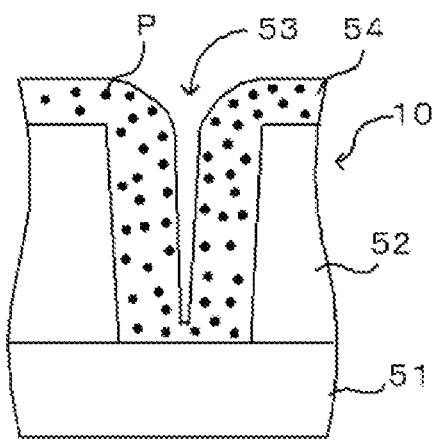
FIGS. 6A to 6C are diagrams illustrating the method of forming the silicon film according to an embodiment.
Figure 6B:
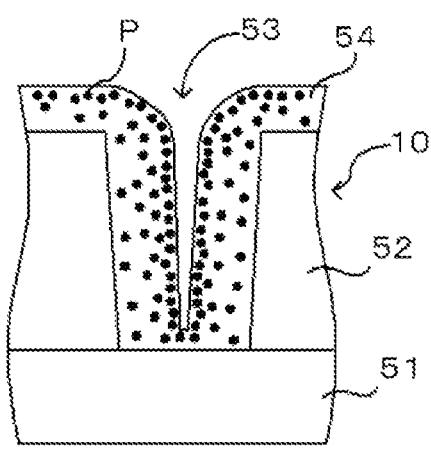
Figure 6C:
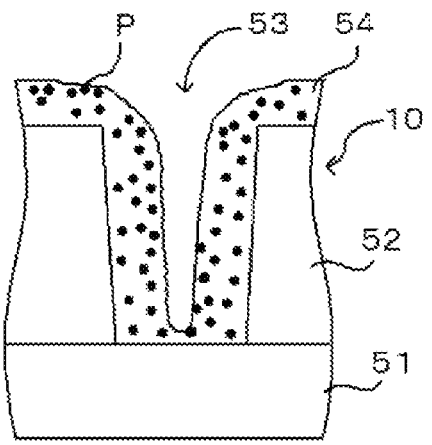

Meanwhile, when the impurities P are additionally added in the vicinity of the surface of the Si film 54 in the state illustrated in FIG. 6A by providing the doping step as in this embodiment, as illustrated in FIG. 6B, it is possible to suppress the variation of the impurity concentration near the surface of the Si film 54. As a result, it is possible to shorten a difference in etching progress due to the difference in the etching rates as illustrated in FIG. 6C, to suppress irregularities from occurring on the surface of the Si film 54, and to suppress the degradation of the surface roughness.

After the Si film 54 is doped with a predetermined amount of impurities P, the supply of the gas containing the impurities from the process gas introduction pipe 13 is stopped. Next, as illustrated in FIG. 3C, a predetermined amount of nitrogen is supplied into the inner tube 3 from the purge gas supply pipe 15, and the interior of the reaction tube 2 is set to a predetermined temperature, for example, 275 degrees C. as illustrated in FIG. 3A. Furthermore, by discharging the gas in the reaction tube 2, the reaction tube 2 is set to a predetermined pressure, for example, 400 P (3 Torr) as illustrated in FIG. 3B. Moreover, the interior of the reaction tube 2 is stabilized at this temperature and pressure (a purge and stabilization step). Furthermore, in order to reliably discharge the gas in the reaction tube 2, the discharge of the gas in the reaction tube 2 and the supply of the nitrogen gas are in some embodiments repeated several times.

According to one embodiment, the temperature in the reaction tube 2 is preferably 100 to 550 degrees C. This is because there is a possibility that the Si film 54 may not be etched in the etching step described below when the temperature is lower than 100 degrees C., and the etching control of the Si film 54 may be difficult when the temperature is higher than 550 degrees C. In some embodiments, the pressure in the reaction tube 2 is 13.3 Pa to 13.3 kPa (0.1 Torr to 100 Torr).

Figure 4C:
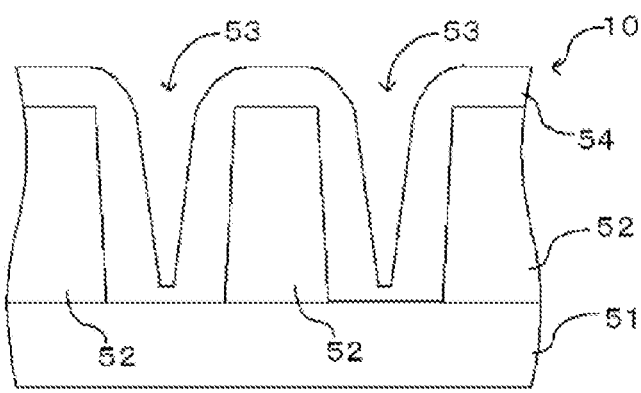

Next, the interior of the reaction tube 2 is stabilized at the predetermined pressure and temperature, as illustrated in FIG. 3C, a predetermined amount of nitrogen is supplied to the inner tube 3 from the purge gas supply pipe 15, and as illustrated in FIG. 3F, a predetermined amount of etching gas, for example, chlorine ($Cl_2$) is supplied from process gas introduction pipe 13 into the reaction tube 2 (an etching step). With this etching step, as illustrated in FIG. 4C, the Si film 54 formed in the grooves 53 of the semiconductor wafer 10 is etched. As described above, since the impurities are additionally doped in the vicinity of the surface of the Si film 54, the etching can be performed without degrading the surface roughness.

Furthermore, in this etching step, the Si film 54 formed in the first film forming step is etched so that the opening portions of the grooves 53 may expand. That is, as illustrated in FIG. 4C, the amount of the etching of the Si film 54 formed on the opening portions of the grooves 53 is increased, and the amount of the etching of the Si film 54 formed near the bottom portions of the grooves 53 is reduced. This makes it easier to form the Si film 54 near the bottom portions of the grooves 53 in the second film forming step to be described below.

Furthermore, in the etching step, the temperature in the reaction tube 2 is, in some embodiments set to 250 to 300 degrees C. Furthermore, the temperature in the reaction tube 2 is in some embodiments set to 400 Pa (3 Torr). By setting the temperature and pressure of the reaction tube 2 to such ranges, it is possible to achieve favorable etching uniformity.

When the desired Si film 54 is etched, the supply of the etching gas from the process gas introduction pipe 13 is stopped. Next, as illustrated in FIG. 3C, and a predetermined amount of nitrogen is supplied into the inner tube 3 from the purge gas supply pipe 15, and the interior of the reaction tube 2 is set to a predetermined temperature, for example, 500 degrees C. as illustrated in FIG. 3A. Furthermore, by discharging the gas in the reaction tube 2, the interior of the reaction tube 2 is set to a predetermined pressure, for example, 266 Pa (2 Torr) as illustrated in FIG. 3B. Moreover, the interior of the reaction tube 2 is stabilized at this temperature and pressure (a purge and stabilization step). Furthermore, in order to reliably discharge the gas in the reaction tube 2, the discharge of the gas in the reaction tube 2 and the supply of the nitrogen gas are in some embodiments repeated several times.

Figure 4D:
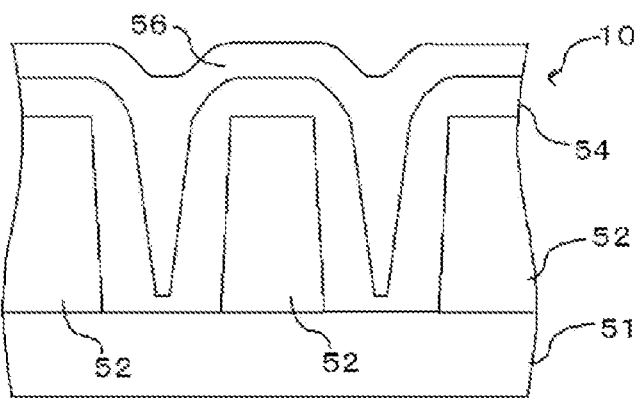

When the interior of the reaction tube 2 is stabilized at the predetermined pressure and temperature, the supply of nitrogen from the purge gas supply pipe 15 is stopped. Moreover, as illustrated in FIGS. 3D and 3E, a predetermined amount of film forming gas, for example, $SiH_4$ and $PH_3$ are supplied into the reaction tube 2 from the process gas introduction pipe 13 (a second film forming step). With the second film forming step, as illustrated in FIG. 4D, the Si film 56 is formed in the grooves 53 of the semiconductor wafer 10.

Here, in the present embodiment, since the doping step is provided prior to the etching step, the surface roughness of the Si film 56 is in a favorable condition. Therefore, it is possible to suppress an occurrence of a void in the grooves 53 when embedding the Si film 56 to the grooves 53. In addition, since the Si film 54 formed in the first film forming step is etched so that the opening portions of the grooves 53 are expanded by the etching step, the Si film 56 is easily formed near the bottom portions of the grooves 53, and it is possible to further suppress the occurrence of the void.

When the desired Si film 56 is formed, the supply of the film forming gas from the process gas introduction pipe 13 is stopped. Next, as illustrated in FIG. 3C, a predetermined amount of nitrogen is supplied into the inner tube 3 from the purge gas supply pipe 15, and the interior of the reaction tube 2 is set to a predetermined temperature, for example, 300 degrees C. as illustrated in FIG. 3A. Furthermore, the gas in the reaction tube 2 is discharged, and the reaction tube 2 is returned to the normal pressure (a purge step). Furthermore, in order to reliably discharge the gas in the reaction tube 2, the discharge of the gas in the reaction tube 2 and the supply of the nitrogen gas are in some embodiments repeated several times. Moreover, the semiconductor wafer 10 (the wafer boat 9) is unloaded from the reaction tube 2 (an unloading step) by lowering the lid 7 by the boat elevator 8. Thus, the formation of the silicon film is finished.

As described above, according to the present embodiment, by performing the doping step after the first film forming step of forming the Si film 54 so that the grooves 53 formed on the surface of the semiconductor wafer 10 have the opening portions, it is possible to suppress the degradation of the surface roughness of the Si film 54 after the etching step of etching the Si film 54 so as to expand the opening portions of the grooves 53. Thus, in the second film forming step of forming the film to embed the Si film 56 in the grooves 53 again, it is possible to suppress the occurrence of the void in the grooves 53, and to embed the Si film 56 in a good condition.

Furthermore, the present disclosure is not limited to the embodiment described above, and various modifications and applications can be made. Hereafter, other embodiments capable of being applied to the present disclosure will be described.

In the above embodiment, the case of using $PH_3$ as the gas containing the impurities has been described as an example, but not limited thereto, and boron trichloride ($BCl_3$) or the like may be used. Furthermore, in the above embodiment, the present disclosure has been described as an example of a case of using $Cl_2$ as the etching gas, but any gas capable of etching the Si film formed in the first film forming step may be used, and other halogen gases such as fluorine ($F_2$) and chlorine trifluoride ($ClF_3$) may also be used. Furthermore, although the present disclosure has been described as an example of the case of using $SiH_4$ as the silicon source of the film forming gas in the above embodiment, other gases may also be used.

Furthermore, the configuration of doping impurities additionally only in the vicinity of the surface of the Si film has been described as an example in the above embodiment, but the present disclosure is not limited thereto. According to another embodiment, the impurities may also be additionally doped in other regions that are not etched in the doping step, as long as it is possible to dope the impurities at least in the region removed by the etching.

In the embodiment described above, a method of forming the silicon film including the first film forming step, the etching step, and the second film forming step has been described mainly as an example, but not limited thereto. For example, when etching back the silicon film doped with impurities such as phosphorous (P), there is a possibility that, unless over-etching is performed, an etching residue may remain, according to a difference in the progress of the etching due to variation of the impurity concentration as described in the above embodiment. Even in this case, by suppressing the variation of the impurity concentration and reducing the difference in the progress of the etching, by performing the doping with the gas containing the impurities prior to performing the etch-back or in the middle of the etch-back, it is possible to perform the etch-back without causing the etching residue while not performing the excessive etching.

Furthermore, although the present disclosure has been described as an example of the case of performing the first film forming step, the etching step, and the second film forming step in the above embodiment, for example, the etching step and the second film forming step may be repeatedly performed several times after the first film forming step.

Although the present disclosure has been described as an example of the case of forming the Si film 54 on the insulating film 52 and in the groove 53 of the semiconductor wafer 10 to have the opening portions of the grooves 53 in the first film forming step in the above embodiment, the Si film 54 may also be formed so that the grooves 53 do not have the opening portion in the first film forming step. In this case, it is possible to obtain the same effect as the above embodiment by etching the Si film 54 in the etching step so that the grooves 53 have the opening portions.

In the above embodiment, although the present disclosure has been described as an example of the case of using the batch type vertical heat treatment device of the double tube structure as the heat treatment device, for example, the present disclosure can also be applied to a batch type heat treatment device of a single tubular structure.

The controller 100 according to the embodiment of the present disclosure can be implemented using a normal computer system regardless of a dedicated system. For example, it is possible to configure the controller 100 that performs the above-described process, by installing in a general-purpose computer a program for executing the process described above from a non-transitory recording medium (a flexible disk, a CD-ROM (Compact Disc Read Only Memory) or the like) storing the program.

Moreover, the means for supplying the programs is arbitrary. The program can be supplied via a predetermined non-transitory recording medium as described above, and otherwise, the program may also be supplied, for example, via a communication line, a communication network, a communication system or the like. In this case, for example, the program may be posted on a bulletin board (BBS: Bulletin Board System) of the communication network, and may be provided by being superimposed on a carrier wave via the network. Moreover, it is possible to perform the process described above, by starting the program provided in this way and executing the program under the control of an OS (Operating System) similar to other application programs.

The embodiments of the present disclosure are useful in the method of forming the silicon film, and the forming apparatus thereof.

According to the present disclosure in some embodiments, it is possible to embed the Si film 54 to effectively suppress the deterioration of the surface roughness after etching.

While certain embodiments have been described, these embodiments have been presented by way of example only, and are not intended to limit the scope of the disclosures. Indeed, the novel methods and apparatuses described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of forming a silicon film in grooves formed on a surface of an object to be processed, the method comprising:
    forming a first silicon film containing impurities so as to embed the first silicon film in the grooves of the object to be processed;
    doping additional impurities in an upper surface of the first silicon film thereby suppressing variations in the concentration of the impurities in the upper surface of the first silicon film, wherein the type of said additional impurities is the same with that of the impurities contained in the first silicon film;
    expanding opening portions of the grooves by etching the doped regions of the first silicon film thereby forming expanded openings of the grooves; and
    forming a second silicon film so as to embed the second silicon film in the expanded openings of the grooves,
    wherein the additional impurities are doped on the upper surface of the first silicon film by performing a gas phase dope using a gas containing the additional impurities, and
    wherein forming the first silicon film, doping additional impurities, expanding opening portions, and forming a second silicon film are sequentially performed within a single reaction chamber.

2. The method of claim 1, wherein the impurities are phosphorus.

3. The method of claim 1, wherein chlorine is used as an etching gas in the expanding.

\* \* \* \* \*